United States Patent [19]

Chatterjee et al.

[11] Patent Number: 5,795,422
[45] Date of Patent: Aug. 18, 1998

[54] METHOD FOR FORMING MOLDED CERAMIC DEVICES HAVING EMBEDDED SPIRAL COILS

[75] Inventors: Dilip K. Chatterjee, Rochester; Edward P. Furlani, Lancaster; Syamal K. Ghosh, Rochester, all of N.Y.

[73] Assignee: Eastman Kodak Company, Rochester, N.Y.

[21] Appl. No.: 775,524

[22] Filed: Jan. 2, 1997

[51] Int. Cl.$^6$ .................................................. B32B 31/26
[52] U.S. Cl. .................................. 156/89.12; 156/89.16; 156/89.17; 156/155; 264/681
[58] Field of Search .................... 156/89, 155, 89.12, 156/89.16, 89.17; 264/610, 618, 619, 681

[56] References Cited

U.S. PATENT DOCUMENTS 5,312,674  5/1994  Haertling et al. .
5,683,649  11/1997  Chatterjee et al. ............... 264/619

Primary Examiner—Curtis Mayes
Attorney, Agent, or Firm—Raymond L. Owens

[57] ABSTRACT

A method of fabricating a molded ceramic device having an embedded spiral coil, is disclosed which includes: forming grooves that provide portions of a spiral coil in surfaces of first and second ceramic plates; aligning the grooves in the first and second ceramic plates and sintering the first and second ceramic plates to form a unitary structure; and filling the aligned grooves with sacrificial material. The method further includes removing the sacrificial material from the unitary structure; and filling the grooves with a conductive material to complete a conductive spiral coil.

16 Claims, 3 Drawing Sheets

METHOD FOR FORMING MOLDED CERAMIC DEVICES HAVING EMBEDDED SPIRAL COILS

CROSS REFERENCE TO RELATED APPLICATIONS

Reference is made to commonly assigned U.S. patent application Ser. No. 08/751,529, filed Nov. 14, 1996, entitled "Method for the Fabrication of Micro-Electromechanical Ceramic Parts", by Chattertjee et al, now U.S. Pat. No. 5,683,649, commonly-assigned U.S. patent application Ser. No. 08/752,133, filed Nov. 21, 1996, entitled "A Method for the Fabrication of Threaded Ceramic Parts" by Edward P. Furlani et al, now U.S. Pat. No. 5,700,411, and commonly-assigned U.S. patent application Ser. No. 08/775,523, filed concurrently herewith, entitled "Miniature Molded Ceramic Devices Having Embedded Spiral Coils" by Chatterjee et al, the teachings of which are incorporated herein.

FIELD OF THE INVENTION

This invention relates generally to methods of forming molded ceramic devices having embedded spiral coils.

BACKGROUND OF THE INVENTION

Conventional electromechanical devices are greater than 1 cubic centimeter in volume. The materials and methods for the fabrication of these devices are inadequate for the fabrication of micro-electromechanical devices which are less than 1 cubic centimeter in volume. Such microdevices can be fabricated using micromachined silicon technology or, alternatively, micromold ceramic technology. One particular device that is difficult to manufacture is that of a surface coil. These coils are particularly suitable for use in actuators, motors or the like. More particularly, a drawback in using the micromolded ceramic technology is that numerous devices such as motors and actuators require energized surface coils to implement the motion of a permanent magnet. A problem with making coils for microdevices, using ceramic technology is that the coil conductors are on the order of 100 microns in diameter or less, and they need to be attached to the surface of the micromolded ceramic device in a predefined fashion. However, highly conductive metals which form the coil, such as copper or gold have melting points below the sintering temperature of commonly used ceramics, and therefore cannot be attached to the ceramics before sintering.

SUMMARY OF THE INVENTION

It is an object of the present invention to provide an improved method for forming molded ceramic devices having embedded conductive spiral coils. This object is achieved in a method of fabricating a molded ceramic device having an embedded spiral coil, comprising the steps of:

a) forming grooves that provide portions of a spiral coil in surfaces of first and second ceramic plates;

b) aligning the grooves in the first and second ceramic plates and sintering the first and second ceramic plates to form a unitary structure;

c) filling the aligned grooves with sacrificial material;

d) removing the sacrificial material from the unitary structure; and e) filling the grooves with a conductive material to complete a conductive spiral coil.

Advantageous Effect Of The Invention

It is an advantage of the present invention to provide a fabrication method which can effectively and yet inexpensively produce miniature molded ceramic devices having embedded spiral coils.

It is another advantage that such miniature molded ceramic devices having embedded spiral coils can be used in harsh corrosive and high temperature environments.

It is a further object of the present invention to provide miniature molded ceramic devices having embedded spiral coils which can be used in motors, actuators, transducers and the like.

These and other aspects, objects, features, and advantages of the present invention will be more clearly understood and appreciated from a review of the following detailed description of the preferred embodiment and appended claims, and by reference to the accompanying figures.

DETAILED DESCRIPTION OF THE INVENTION

The present invention involves miniature molded ceramic devices having embedded spiral coils. When the term "miniature" is used it refers to the fact that the spiral grooves have a diameter of about 100micrometers or less. In forming the spiral coil, sacrificial material which is a refractory material such as tungsten (W), molybdenum (Mo), or Tantalum (Ta), which have a melting point above the sintering temperature of the ceramic mold can be used to form the miniature molded ceramic devices having embedded spiral coils.

Figure 1:
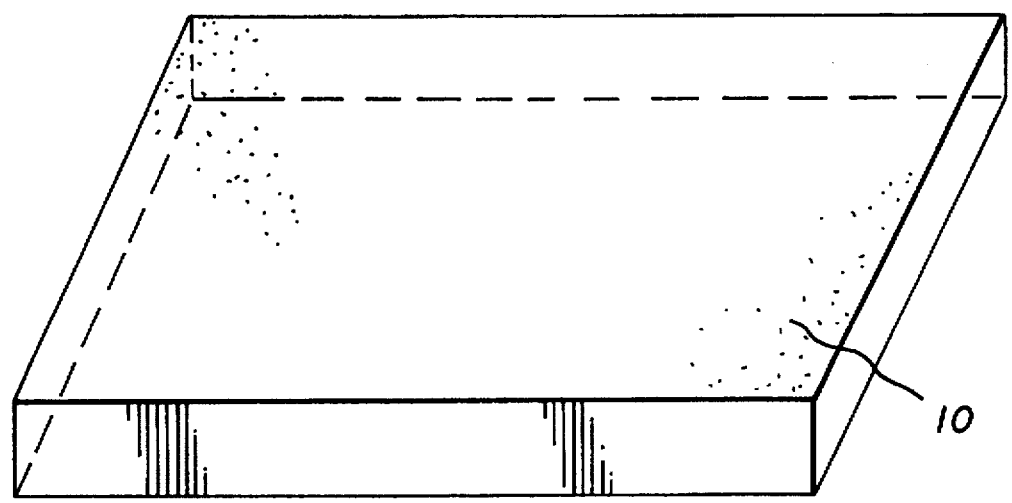
FIG. 1 is a perspective view of a ceramic plate which can be used in accordance with the present invention.

In accordance with the present invention a ceramic green plate 10 is shown in FIG. 1. Two of these plates which have a thickness of about 200–300 micrometers in thickness will be used as shortly described. Length and width of these pates are determined from the spatial size of the spiral coils. The use of the term "green" means that when the two plates are in contact with each other they can be sintered and bonded together to form a unitary structure. Green plates are well understood in the art and are made by using ceramic powders. One particular effective material is a tetragonal zirconia ceramic powder that can be micromolded to form the plate by standard methods such as tape casting, dry press, or cold isostatic pressing. Other ceramic materials which can be used are ceramics such as $Al_2O_3$, $ZrO_2$, AlN, BN, MgO, $Al_2O_3$—$ZrO_2$ and other oxide and non-oxide ceramics and their composites thereof. The sintering time for zirconia and tetragonal zirconia and its composites is about 2 hours for a temperature of about 1200° C.

Figure 2:
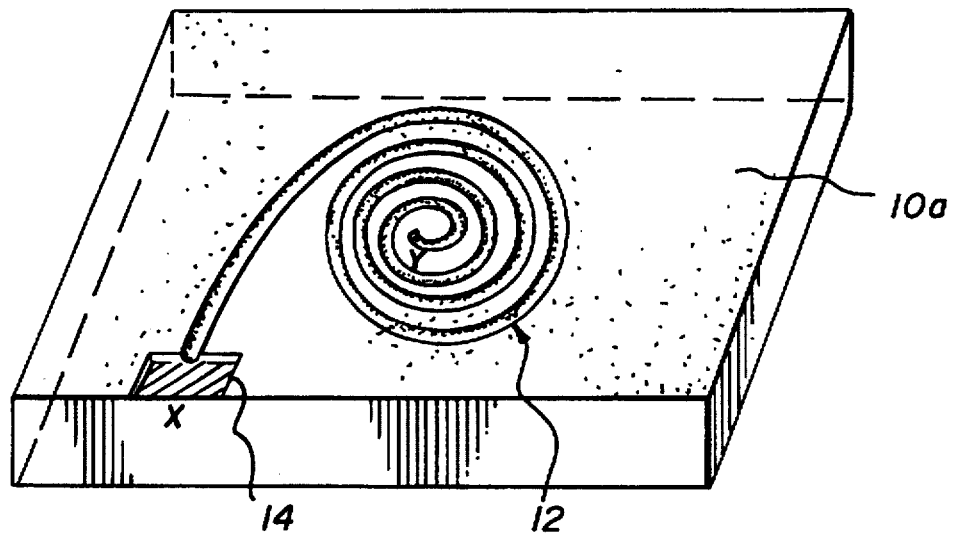
FIG. 2 shows a portion of a spiral groove and opening corresponding to a pad formed in a surface of a ceramic plate.

Referring now to FIG. 2, where a bottom green ceramic plate 10a is shown. A spiral groove 12 corresponding to a portion of a coil to be formed has been machined into the surface of the plate 10a. Typically the width and depth of the machined groove is about 120–150 micrometers. At an edge of the ceramic plate 10a, the spiral groove 12 terminates in an opening 14 which will correspond to a conductive pad when after the coil is formed. A standard computer assisted numerically controlled machining device can be used to form the spiral groove 12 and the opening 14. Alternatively, during the process of micromolding the spiral groove 12 and the opening 14 can be formed by making features corresponding to the spiral groove 12 and the opening 14 in the mold (not shown) used to form the plate.

Figure 3:
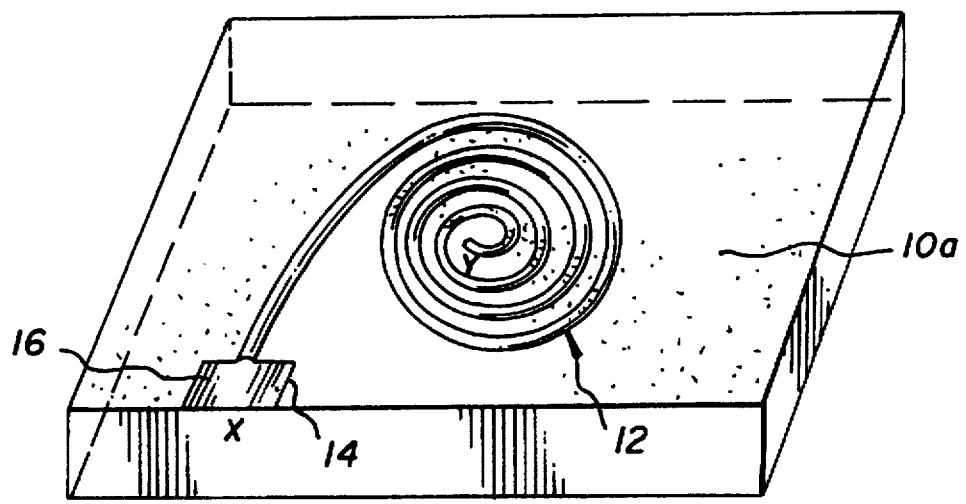
FIG. 3 shows the arrange of FIG. 2 but with the spiral groove portion and opening formed with sacrificial material.

Referring now to FIG. 3, the spiral groove 12 and opening 14 are filled with sacrificial material. A preferred arrangement is to use a high temperature sacrificial refractory fiber 16 of about 100 microns in diameter. In the opening 14, several strands of the sacrificial refractory fiber 16 need to be used. The sacrificial refractory fiber can be formed of Tungsten (W), Molybdenum (Mo), and Tantalum (Ta). Alternatively, the spiral groove 12 and the opening 14 can be filled with thick film inks which are based on refractory metals and oxides. The refractory sacrificial material is needed since upon sintering, which will be described later, the temperatures need to be at a very high level between 1200°–1700° C. so as to preclude fracturing by chemical reaction with molten metal of the micromold which will be formed during the sintering process. During the sintering process the green ceramic article shrinks. The refractory sacrificial material/fiber is used within the grooves to prevent closure of the grooves.

Figure 4:
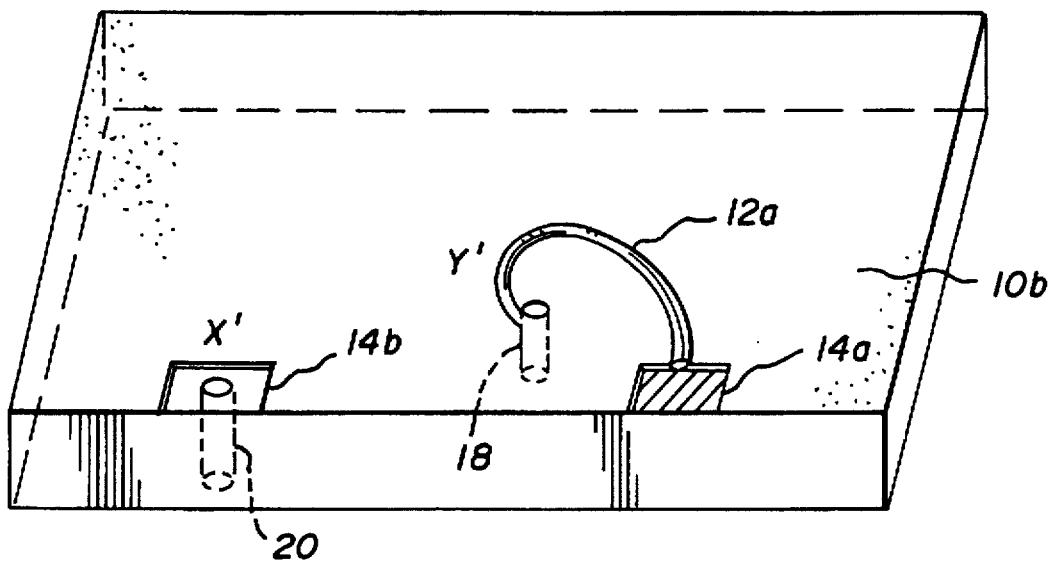
FIG. 4 shows another ceramic plate with the remaining portion of the spiral groove and openings corresponding to pads when plates of FIGS. 2 and FIG. 4 are aligned.

Referring now to FIG. 4, where a top green ceramic plate 10b is formed. The ceramic plate 10b includes a portion of a spiral groove 12a and another opening 14a which corresponds to another pad. The spiral groove 12a and opening 14a also are filled with sacrificial material in the same manner as discussed with respect to FIG. 2. Two holes 18 and 20 (shown in dotted line) are drilled through the ceramic plate 10b. One hole 18 terminates at the end of the spiral groove 12a which corresponds to the center of the coil to be formed. The other opening 20 is connected to another spaced apart opening 14b which when the ceramic plates 10a and 10b are aligned will be aligned with the opening 14 in the bottom ceramic plate 10a. These openings 18 and 20 are used in the process of removing the sacrificial material and in making the conductive coil and conductive pads for the coil. More particularly, the dimensions of the ceramic plates 10a and 10b and their openings 14, 14a, and the holes 18, 20, and the structure of their spiral grooves 12 and 12a are such that when the ceramic plates 10a and 10b are aligned a pattern is formed for forming a complete conductive spiral coil with conductive pads. Typically, each of the openings 14, 14a and 14b have dimensions of about 100 square microns and which are recessed 100 microns into the surface of their corresponding ceramic plate 10a and 10b.

Figure 5:
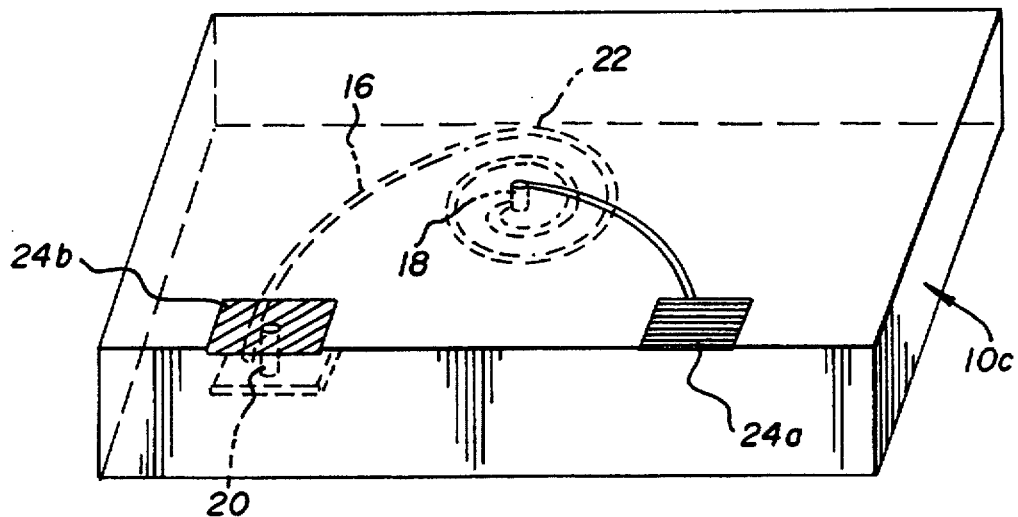
FIG. 5 shows the plates of FIGS. 2 and 4 aligned with one on top of the other after a sintering step which has formed a unitary structure.

Referring to FIG. 5, the top and bottom ceramic plates 10a, 10bhave been placed and aligned on each other. The aligned grooves are filled with a sacrificial material. They are then sintered to produce a unitary structure 10c which has an internal pattern corresponding to the spiral coil. For tetragonal zirconia ceramic the sintering temperature and time was 1500° C. for 2 hours. The unitary structure 10c includes the embedded sacrificial refractory fiber 16. This sacrificial refractory fiber 16 is now etched away using an etch which will attack the sacrificial material but leave intact the patterned corresponding to the spiral coil and the conductive pads. This etchant can be ammonium hydroxide or hydrochloric acid. This results in a continuous spiral groove 22 without sacrificial material of approximately 100microns in diameter and a major portion of the grooves is embedded approximately 150–250 micrometers below the surface of the unitary structure 10c, and terminated at either end with openings 24a and 24b corresponding to conductive pads. Conveniently the etch can be delivered through the opening 24a corresponding to one conductive pad and out through the opening 24b corresponding to the other conductive pad. The conductive pads 24a and 24bare continuous and connected to each other by the two portions of the spiral groove and the holes 18 and 20.

Figure 6:
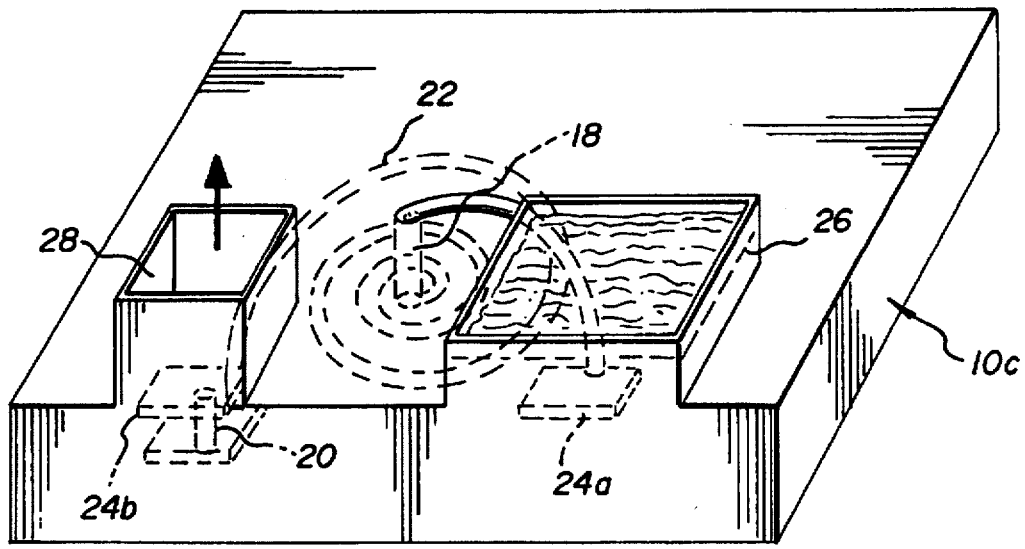
FIG. 6 shows an arrangement for providing conductive material into the spiral groove and the openings corresponding to pads of the unitary structure of FIG. 5.

Referring to FIG. 6, which shows the unitary structure 10c and with the spiral groove 22 corresponding to the spiral coil to be formed and the openings 24a and 24b that correspond to the conductive pads. A tray 26 containing a liquid conductive material which permits the material to be delivered through the opening 24a into the interior structure of the patterned spiral groove 22. A source of vacuum 28 is also provided to facilitate the delivery of the liquid conductive material into the patterned spiral groove 22 of the unitary structure 10c. The vacuum source 28 lowers the pressure throughout the entire patterned structure corresponding to the spiral groove 22 and openings 24a and 24b. When the liquid conductive material has completely filled the openings 24a and 24b, the spiral groove 22 and the hole 18, the process is stopped and the liquid conductive material permitted to solidify thereby forming a completed spiral coil with conductive pads and an electrical connection to the center of the spiral coil formed by the conductive material in the hole 18. The liquid conductive material can be a molten pool of conductive metal and its alloy such as palladium, gold, silver metal and their alloys, silver-copper alloy, and copper-tin alloy or combinations thereof or alternatively a thin or thick film conductive paste applied over the top of the conductive pad. Since the opening 24b is connected to the source of vacuum 28, the liquid conductive material is continually pumped so as to draw the molten alloy through the spiral path out through the opening 24b. Both openings 24a and 24b correspond to a separate pad. In this way, highly conductive metal is made to fill the structure corresponding to the spiral coil connecting pads and the electrical connection to the center of the spiral coil.

The invention has been described with reference to a preferred embodiment. However, it will be appreciated that variations and modifications can be effected by a person of ordinary skill in the art without departing from the scope of the invention.

Parts List:
10 plate
10a bottom plate
10b top plate
10c unitary structure
12 spiral groove
12a spiral groove portion
14 opening
14a opening
16 sacrificial refractory fiber
18 hole
20 hole
22 spiral groove
24a opening
24b opening
26 tray
28 vacuum source

We claim:

1. A method of fabricating a molded ceramic device having an embedded spiral coil, comprising the steps of:

a) forming grooves that provide portions of a spiral coil in surfaces of first and second ceramic plates;

b) aligning the grooves in the first and second ceramic plates and filling the aligned grooves with sacrificial material c) sintering the first and second ceramic plates with the sacrificial material to form a unitary structure:

d) removing the sacrificial material from the unitary structure; and e) filling the grooves with a conductive material to complete a conductive spiral coil.

2. The method of forming a molded ceramic device having an embedded spiral coil according to claim I wherein the first and second ceramic plates are materials selected from the group consisting of $Al_2O_3$, $ZrO_2$, AlN, BN, MgO, $Al_2O_3$—$ZrO_2$ and their composites thereof.

3. The method of forming a molded ceramic device having an embedded spiral coil according to claim 1 wherein the conductive material is selected from the group consisting of palladium, gold, silver metal and their alloys, silver-copper alloy, copper-tin alloy and composites thereof.

4. The method of forming a molded ceramic device having an embedded spiral coil according to claim 1 wherein the conductive material is conductive thick film paste.

5. The method of forming a molded ceramic device having an embedded spiral coil according to claim I wherein the conductive material is conductive thin film paste.

6. The method of forming a molded ceramic device having an embedded spiral coil according to claim 1 wherein an electrical connection is provided by a hole formed in the first ceramic plate and other conductive material placed in such hole and connected to the center of the conductive spiral coil.

7. The method of forming a molded ceramic device having an embedded spiral coil according to claim 1 wherein aligned conductive pads are formed in the first and second ceramic plates permitting electrical connection to the conductive spiral coil.

8. A method of fabricating a molded ceramic device having an embedded spiral coil, comprising the steps of:

a) forming grooves that provide portions of a spiral coil in surfaces of first and second ceramic plates and forming cut-away portions in the surfaces of the first and second ceramic plates to provide openings for conductive pad connections;

b) forming a hole in the second ceramic plate to provide a hole for an electrical connection;

c) aligning the grooves and the openings in the first and second ceramic plates and filling the aligned grooves and the aligned openings with sacrificial material;

d) sintering the first and second ceramic plates with the sacrificial material to form a unitary structure;

e) chemically etching the sacrificial material from the unitary structure; and f) filling the grooves, the hole in the second ceramic plate and the openings with a conductive material to complete a conductive spiral coil having pads, the conductive material in such hole arranged so that such other conductive material is connected to the center of the conductive spiral coil.

9. The method according to claim 8, wherein when the grooves and openings are filled with sacrificial material the hole is also filled with sacrificial material and such sacrificial material in the hole is also chemically etched.

10. The method of forming a molded ceramic device having an embedded spiral coil according to claim 9 wherein the first and second ceramic plates are formed from materials selected from the group consisting of $Al_2O_3$, $ZrO_2$, AlN, BN, MgO, $Al_2O_3$—$ZrO_2$ and their composites thereof.

11. The method of forming a molded ceramic device having an embedded spiral coil according to claim 9 wherein the conductive material is selected from the group consisting of palladium, gold, silver metal and its alloys, silver-copper alloy, copper-tin alloy and combinations thereof.

12. The method of forming a molded ceramic device having an embedded spiral coil according to claim 9 wherein the conductive material is conductive thick film paste.

13. the method of forming a molded ceramic device having an embedded spiral coil according to claim 9 wherein the conductive material is conductive thin film paste.

14. The method of forming a molded ceramic device having an embedded spiral coil according to claim 9 wherein aligned conductive pads are formed in the first and second ceramic plates permitting electrical connection to the conductive spiral coil.

15. the method according to claim 9, wherein step of filling the grooves and openings with conductive material includes providing a liquid conductive material in one opening corresponding to one pad of the spiral groove and lowering pressure in the spiral groove through the other opening corresponding to another pad.

16. the method according to claim 9 wherein sintering is at a temperature in the range of 1200°–1700° C. for a time in a range of 1–3 hours.

* * * * *